(12) United States Patent
Kaneko

(10) Patent No.: US 9,036,394 B2
(45) Date of Patent: May 19, 2015

(54) METHOD OF DRIVING NONVOLATILE SEMICONDUCTOR DEVICE

(71) Applicant: Panasonic Corporation, Osaka (JP)

(72) Inventor: Yukihiro Kaneko, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 12 days.

(21) Appl. No.: 14/143,544

(22) Filed: Dec. 30, 2013

(65) Prior Publication Data

US 2014/0112051 A1    Apr. 24, 2014

Related U.S. Application Data

(63) Continuation of application No. PCT/JP2013/003254, filed on May 22, 2013.

(30) Foreign Application Priority Data

Jun. 4, 2012 (JP) ................................. 2012-126773

(51) Int. Cl.
| | |
|---|---|
| *G11C 13/00* | (2006.01) |
| *H03K 19/21* | (2006.01) |
| *H01L 21/28* | (2006.01) |
| *H01L 29/66* | (2006.01) |
| *H01L 27/115* | (2006.01) |
| *G11C 11/22* | (2006.01) |
| *H01L 29/78* | (2006.01) |

(52) U.S. Cl.
CPC ............ *G11C 13/0069* (2013.01); *H03K 19/21* (2013.01); *H01L 21/28291* (2013.01); *H01L 29/6684* (2013.01); *H01L 27/1159* (2013.01); *G11C 11/2275* (2013.01); *G11C 11/2259* (2013.01); *H01L 29/78391* (2014.09)

(58) Field of Classification Search
None
See application file for complete search history.

(56) References Cited

U.S. PATENT DOCUMENTS

| | | | |
|---|---|---|---|
| 6,473,332 | B1 | 10/2002 | Ignatiev et al. |
| 2009/0224224 | A1 | 9/2009 | Fujii et al. |
| 2010/0244022 | A1* | 9/2010 | Takahashi et al. ............... 257/43 |
| 2011/0309860 | A1 | 12/2011 | Kaneko |

FOREIGN PATENT DOCUMENTS

| | | |
|---|---|---|
| JP | 2008-270313 A | 11/2008 |
| JP | 2009-033188 A | 2/2009 |
| WO | WO 2011/111305 A1 | 9/2011 |

OTHER PUBLICATIONS

International Search Report for corresponding International Application No. PCT/JP2013/003254 mailed Jul. 9, 2013.

* cited by examiner

*Primary Examiner* — James G Norman
(74) *Attorney, Agent, or Firm* — Renner, Otto, Boisselle & Sklar, LLP

(57) ABSTRACT

Pulse voltages V1 and V2 are applied to a first upper gate electrode and a second upper gate electrode, respectively, for a period T1 which is shorter than a period necessary to invert all the polarizations included in a ferroelectric film, while voltages Vs, Vd, and V3 are applied to a source electrode, a drain electrode, and a lower gate electrode film, respectively, so as to increase the values of the widths WRL1 and WRL2 and so as to decrease the value of the width WRH. The absolute values of the pulse voltages V1 and V2 are smaller than that of a voltage necessary to invert all the polarizations included in the ferroelectric film. The voltage Vs, the voltage Vd, the voltage V3, the pulse voltage V1, and the pulse voltage V2 satisfy the following relationship: Vs, Vd, V3>V1, V2.

16 Claims, 7 Drawing Sheets

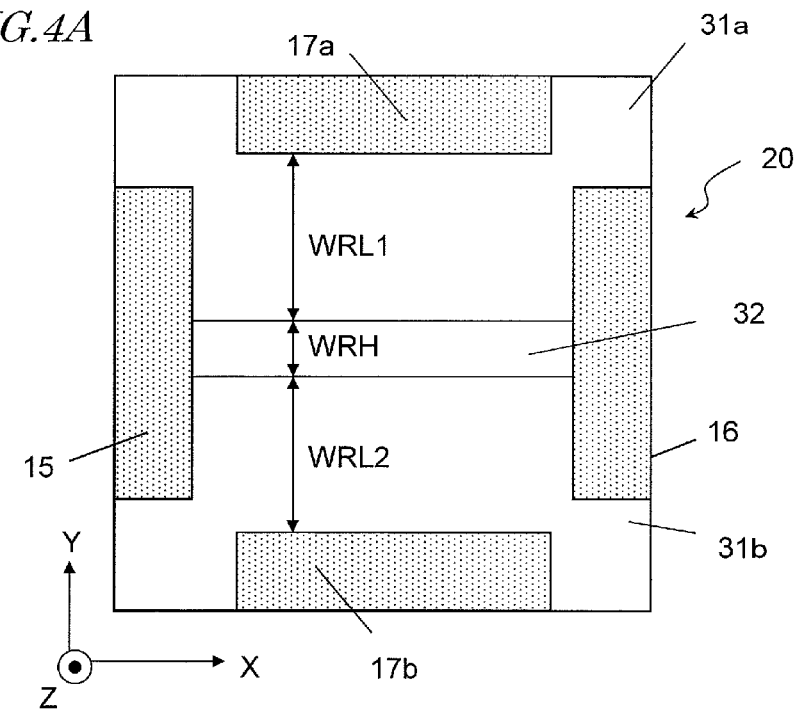
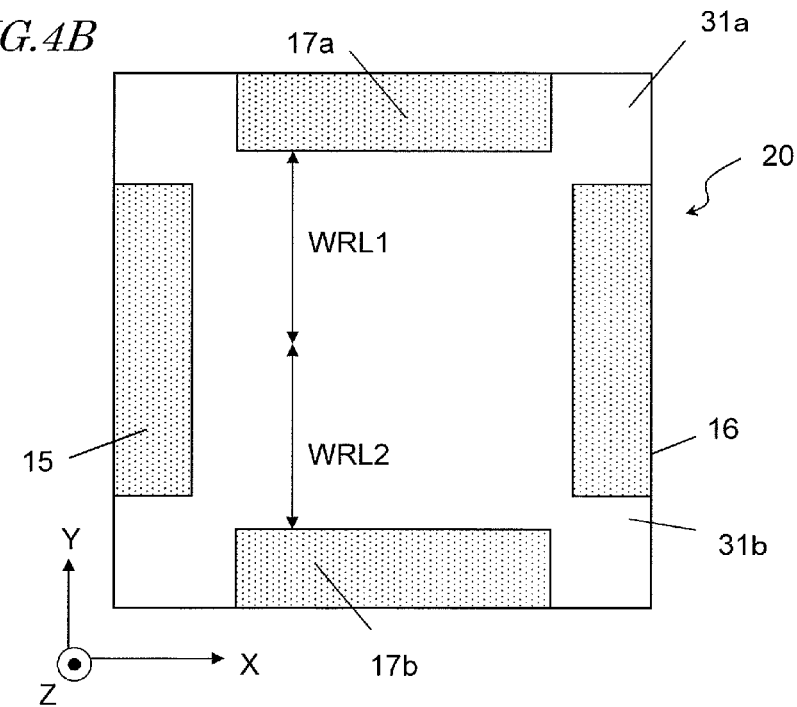

METHOD OF DRIVING NONVOLATILE SEMICONDUCTOR DEVICE

This is a continuation of International Application No. PCT/JP2013/003254, with an international filing date of May 22, 2013, which claims priority of Japanese Patent Application No. 2012-126773, filed on Jun. 4, 2012, the contents of which are hereby incorporated by reference.

BACKGROUND

1. Technical Field

The present disclosure relates to a method for operating a nonvolatile semiconductor device.

2. Description of the Related Art

FIG. 8A and FIG. 8B show a top view and a cross-sectional view of the nonvolatile semiconductor device disclosed in International Publication No. WO 2011/111305, respectively.

As shown in FIG. 8A and FIG. 8B, this nonvolatile semiconductor device 920 comprises a substrate 911, a control electrode film 912, a ferroelectric film 913, and a semiconductor film 914. A source electrode 915, a drain electrode 916, and first to fourth input electrodes 917a-917d are formed on the semiconductor film 914.

SUMMARY

The present disclosure provides a novel method for operating a nonvolatile semiconductor device.

In one general aspect, a method for operating a nonvolatile semiconductor device disclosed herein comprises steps of: a step (a) of preparing the nonvolatile semiconductor device, wherein the nonvolatile semiconductor device comprises a lower gate electrode film, a ferroelectric film, a semiconductor film, a source electrode, a drain electrode, a first upper gate electrode, and a second upper gate electrode; the lower gate electrode film, the ferroelectric film, and the semiconductor film are stacked in this order; the source electrode, the drain electrode, the first upper gate electrode, and the second upper gate electrode are formed on the semiconductor film; Z direction represents a stack direction of the lower gate electrode film, the ferroelectric film, and the semiconductor film; when viewed in a top view, the source electrode and the drain electrode face each other along X direction; when viewed in a top view, the first upper gate electrode and the second upper gate electrode face each other along Y direction; the X direction and the Y direction are perpendicular to each other; both of the X direction and the Y direction are perpendicular to the Z direction; a high-resistance area, a first low-resistance area, and a second low-resistance area are formed in the semiconductor film; when viewed in a top view, the high-resistance area has a width WRH along the Y direction; when viewed in a top view, the first low-resistance area has a width WRL1 along the Y direction; when viewed in a top view, the second low-resistance area has a width WRL2 along the Y direction; the value of the width WRH is not less than zero; the value of the width WRL1 is not less than zero; the value of the width WRL2 is not less than zero; when viewed in a top view, the high-resistance area, the first low-resistance area, and the second low-resistance area are interposed between the first upper gate electrode and the second upper gate electrode; when viewed in a top view, the first low-resistance area is interposed between the first upper gate electrode and the high-resistance area; when viewed in a top view, the second low-resistance area is interposed between the second upper gate electrode and the high-resistance area; and when viewed in a top view, the high-resistance area is interposed between the first low-resistance area and the second low-resistance area; a step (b) of applying pulse voltages V1 and V2 to the first upper gate electrode and the second upper gate electrode, respectively, for a period T1 which is shorter than a period necessary to invert all the polarizations included in the ferroelectric film, while voltages Vs, Vd, and V3 are applied to the source electrode, the drain electrode, and the lower gate electrode film, respectively, so as to increase the values of the widths WRL1 and WRL2 and so as to decrease the value of the width WRH, wherein the absolute value of the pulse voltage V1 is smaller than that of a voltage necessary to invert all the polarizations included in the ferroelectric film; the absolute value of the pulse voltage V2 is smaller than that of a voltage necessary to invert all the polarizations included in the ferroelectric film; and the voltage Vs, the voltage Vd, the voltage V3, the pulse voltage V1, and the pulse voltage V2 satisfy the following relationship (I): Vs, Vd, V3>V1, V2 (I); and a step (c) of repeating the step (b) n times (n represents an integer of two or more), until a resistance value between the source electrode and the drain electrode becomes a predetermined value or less.

According to the above aspect, it is possible to provide a novel method for operating a nonvolatile semiconductor device.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIG. 4A shows a top view of a nonvolatile semiconductor device according to an exemplary embodiment.

FIG. 4B shows a top view of a nonvolatile semiconductor device according to an exemplary embodiment.

DETAILED DESCRIPTION

An exemplary embodiment of the present disclosure is described below with reference to the drawings. Note however that unnecessarily detailed descriptions may be omitted. For example, detailed descriptions on what are well known in the art or redundant descriptions on substantially the same configurations may be omitted. This is to prevent the following description from becoming unnecessarily redundant, to make it easier for a person of ordinary skill in the art to understand.

Note that the present inventor provides the accompanying drawings and the following description in order for a person of ordinary skill in the art to sufficiently understand the present disclosure, and they are not intended to limit the subject matter set forth in the claims.

Embodiment 1

Figure 1A:
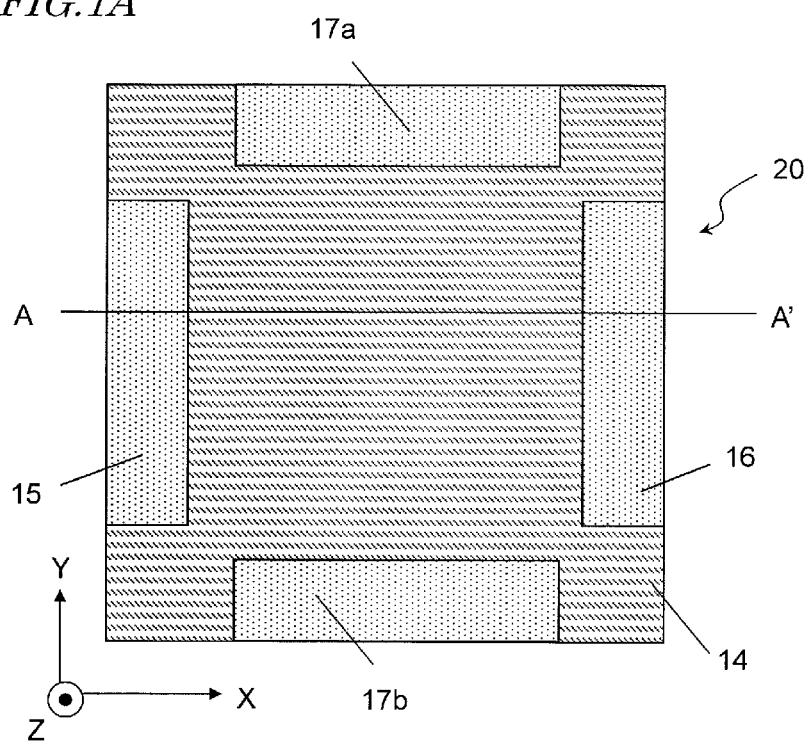
FIG. 1A shows a top view of a nonvolatile semiconductor device according to an exemplary embodiment.
Figure 1B:
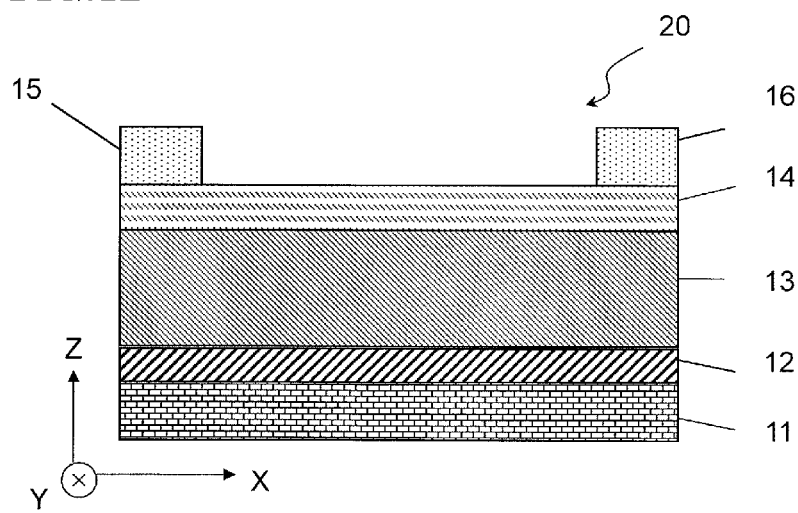
FIG. 1B shows a cross-sectional view of a nonvolatile semiconductor device according to an exemplary embodiment.

FIG. 1A shows a top view of a nonvolatile semiconductor device 20 according to the embodiment 1. FIG. 1B shows a cross-sectional view of the nonvolatile semiconductor device 20 along the line A-A' depicted in FIG. 1A.

As shown in FIG. 1B, the nonvolatile semiconductor device 20 comprises a lower gate electrode film 12, a ferroelectric film 13, a semiconductor film 14, a source electrode 15, and a drain electrode 16. The lower gate electrode film 12, the ferroelectric film 13, and the semiconductor film 14 are stacked in this order on a substrate 11 (e.g., silicon substrate). The ferroelectric film 13 is in contact with the semiconductor film 14, for example. However, another film such as an insulation film having a significantly thin thickness may be interposed between the ferroelectric film 13 and the semiconductor film 14.

An example of the lower gate electrode film 12 is a laminate comprised of an $SrRuO_3$ film, a platinum film, and a titanium film.

An example of the material of the ferroelectric film 13 is $Pb(Zr, Ti)O_3$, $SrBi_2Ta_2O_9$, or $Bi_4Ti_3O_{12}$.

An example of the material of the semiconductor film 14 is ZnO, GaN, or in $GaZnO_x$.

An example of the source electrode 15 is a laminate composed of a platinum film and a titanium film. An example of the drain electrode 16 is also a laminate composed of a platinum film and a titanium film.

As shown in FIG. 1A, the source electrode 15 and the drain electrode 16 are formed on the semiconductor film 14. Furthermore, a first upper gate electrode 17a and a second upper gate electrode 17b are formed on the semiconductor film 14.

An example of the first upper gate electrode 17a is a laminate composed of a gold film, a platinum film, and a titanium film. An example of the second upper gate electrode 17b is also a laminate composed of a gold film, a platinum film, and a titanium film.

Here, three directions, namely, X direction, Y direction, and Z direction, used in the instant specification are described. These X, Y, and Z directions are depicted in FIG. 1A-FIG. 5.

As shown in FIG. 1A and FIG. 1B, the Z direction represents the stack direction of the lower gate electrode film 12, the ferroelectric film 13, and the semiconductor film 14.

The X direction is parallel to the direction where the source electrode 15 and the drain electrode 16 face each other. In other words, as shown in FIG. 1A and FIG. 1B, the source electrode 15 and the drain electrode 16 face each other along the X direction.

The Y direction is parallel to the direction where the first upper gate electrode 17a and the second upper gate electrode 17b face each other. In other words, as shown in FIG. 1A, the first upper gate electrode 17a and the second upper gate electrode 17b face each other along the Y direction in a top view.

Needless to say, the X direction and the Y direction are perpendicular to each other. Both of the X direction and the Y direction are perpendicular to the Z direction.

Figure 2A:
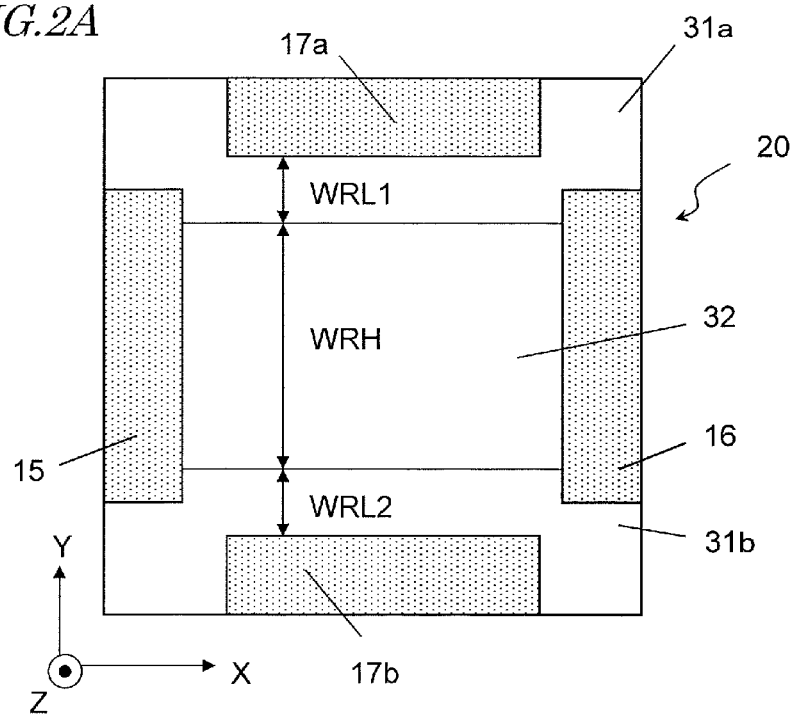
FIG. 2A shows a top view of a nonvolatile semiconductor device according to an exemplary embodiment.

As shown in FIG. 2A, a high-resistance area 32, a first low-resistance area 31a, and a second low-resistance area 31b are formed in the semiconductor film 14.

The high-resistance area 32 has a width WRH along the Y direction. The value of the width WRH is not less than zero.

The first low-resistance area 31a has a width WRL1 along the Y direction. The value of the width WRL1 is not less than zero. Similarly, the second low-resistance area 31b has a width WRL2 along the Y direction. The value of the width WRL2 is not less than zero.

As shown in FIG. 2A, the high-resistance area 32, the first low-resistance area 31a, and the second low-resistance area 31b are interposed between the first upper gate electrode 17a and the second upper gate electrode 17b along the Y direction.

The first low-resistance area 31a is interposed between the first upper gate electrode 17a and the high-resistance area 32. Similarly, the second low-resistance area 31b is interposed between the second upper gate electrode 17b and the high-resistance area 32. The high-resistance area 32 is interposed between the first low-resistance area 31a and the second low-resistance area 31b.

Figure 2B:
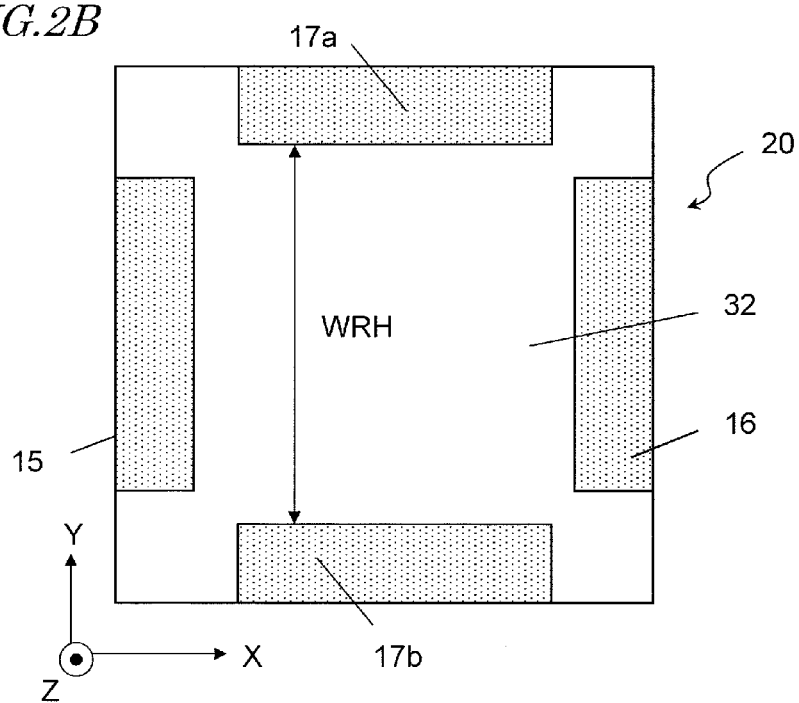
FIG. 2B shows a top view of a nonvolatile semiconductor device according to an exemplary embodiment.

FIG. 2B shows the initial state after a reset operation, which is described later. The reset operation increases the resistance value of the semiconductor film 14. Thus, the whole area of the semiconductor film 14 is allowed to become the high-resistance area 32. In FIG. 2B, both of the widths WRL1 and WRL2 are zero. Accordingly, neither the first low-resistance area 31a nor the second low-resistance area 31b is formed in the semiconductor film 14.

Then, a method for operating the nonvolatile semiconductor device 20 is described.

In the nonvolatile semiconductor device 20, an electric current flowing through the semiconductor film 14 is controlled, depending on the direction of the polarization included in the ferroelectric film 13. More particularly, when the polarization of the ferroelectric film 13 is set upwardly, electrons induced in the semiconductor film 14 decrease the resistance value of the semiconductor film 14. On the contrary, when the polarization of the ferroelectric film 13 is set downwardly, electrons are drained from the semiconductor film 14 to increase the resistance value of the semiconductor film 14.

It is beneficial that the reset operation is conducted first. In the reset operation, while voltages V1, V2, Vs, and Vd which satisfy the relationship: V1=V2=Vs=Vd are applied to the first upper gate electrode 17a, the second upper gate electrode 17b, the source electrode 15, and the drain electrode 16, respectively, a voltage V3 which satisfy the relationship: V1>V3 is applied to the lower gate electrode film 12.

More particularly, the voltage V3 of −15 volts is applied to the lower gate electrode film 12, while voltages of 0 volts are applied to the first upper gate electrode 17a, the second upper gate electrode 17b, the source electrode 15, and the drain electrode 16, for example. In this way, all the directions of the polarization of the ferroelectric film 13 are set downwardly to increase the resistance value of the whole semiconductor film 14. At this point, it is beneficial that the state shown in FIG. 2B is configured in the nonvolatile semiconductor device 20.

Then, while the voltages Vs, Vd, and V3 are applied to the source electrode 15, the drain electrode 16, and the lower gate electrode film 12, respectively, pulse voltages V1 and V2 are applied to the first upper gate electrode 17a and the second upper gate electrode 17b, respectively, for a period T1. The absolute values of the pulse voltages V1 and V2 are smaller than that of a voltage necessary to invert all the polarizations included in the ferroelectric film 13. The period T1 is shorter than a period necessary to invert all the polarizations included in the ferroelectric film 13.

The voltage Vs, the voltage Vd, the voltage V3, the pulse voltage V1, and the pulse voltage V2 satisfy the following relationship (I):

$$Vs, Vd, V3 > V1, V2 \quad (I)$$

For example, the voltage Vs, the voltage Vd, the voltage V3, the pulse voltage V1, and the pulse voltage V2 satisfy the following relationships (II) and (III).

$$Vs = Vd = V3 \quad (II)$$

$$V1 = V2 < V3 \quad (III)$$

The application of the pulse voltages V1 and V2 allows the direction of the polarization included in the ferroelectric film 13 to set upwardly. However, as described above, the absolute values of both pulse voltages V1 and V2 are smaller than that of the voltage necessary to invert all the polarizations included in the ferroelectric film 13, and both of the pulse voltages V1 and V2 are applied for a period T1 which is shorter than a period necessary to invert all the polarizations included in the ferroelectric film 13. For this reason, only a polarization included in a portion of the ferroelectric film 13 is set upwardly. All the polarizations included in the ferroelectric film 13 are not set upwardly.

Figure 3:
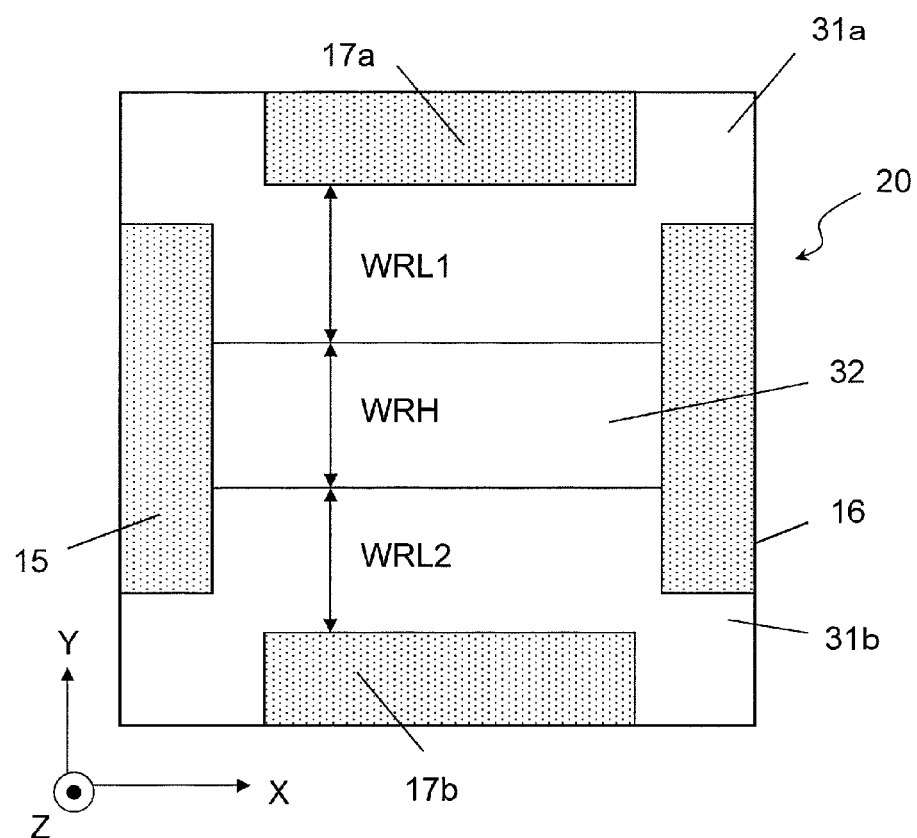
FIG. 3 shows a top view of a nonvolatile semiconductor device according to an exemplary embodiment.
Figure 5:
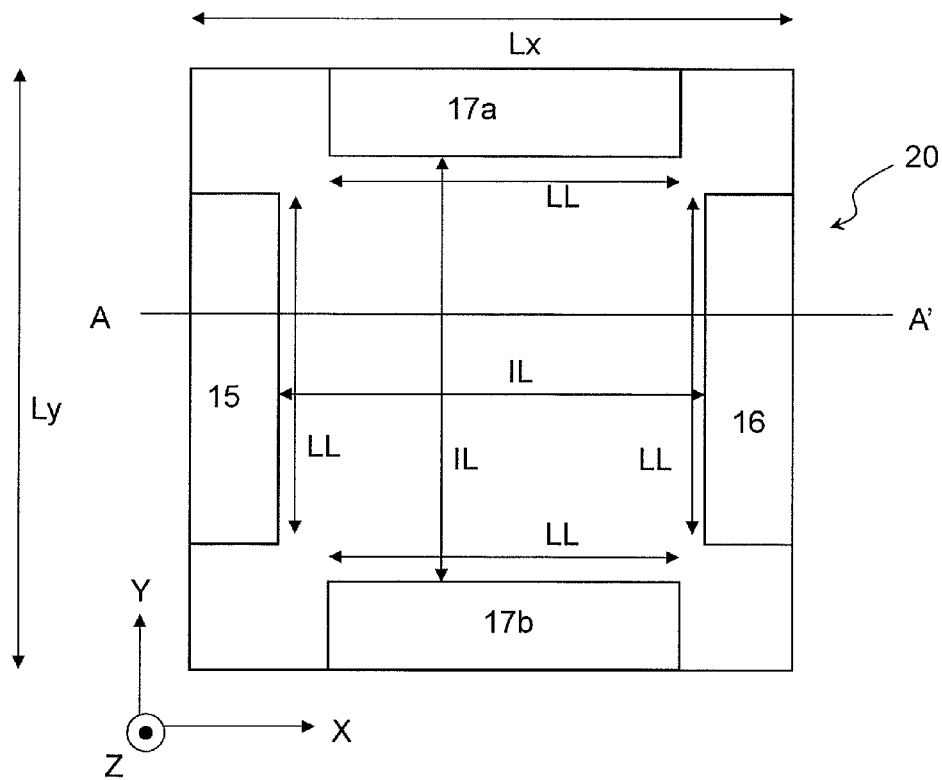
FIG. 5 shows a top view of a nonvolatile semiconductor device according to the example 1.

In this way, the state of the nonvolatile semiconductor device 20 changes from the state shown in FIG. 2A to the state shown in FIG. 3. Alternatively, the state of the nonvolatile semiconductor device 20 changes from the state shown in FIG. 2B to the state shown in FIG. 3.

As is clear from FIG. 2A and FIG. 3, the width WRH shown in FIG. 3 is smaller than the width WRH shown in FIG. 2A. The width WRL1 shown in FIG. 3 is greater than the width WRL1 shown in FIG. 2A. The width WRL2 shown in FIG. 3 is greater than width WRL2 shown in FIG. 2A.

Figure 7:
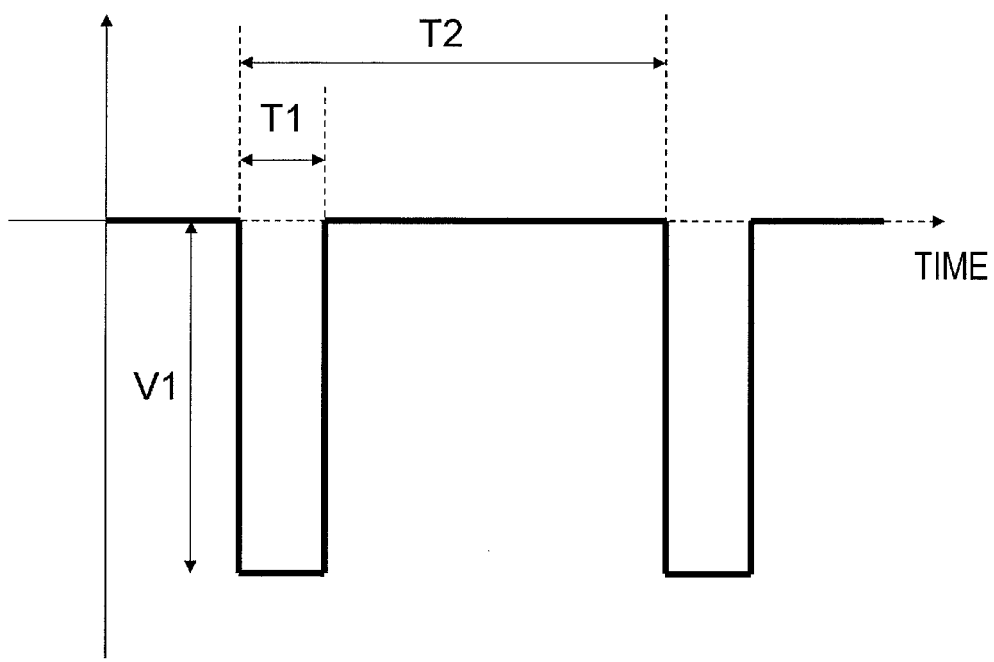
FIG. 7 shows a pulse voltage V1, which is applied to a nonvolatile semiconductor device according to an exemplary embodiment.
Figure 8A:
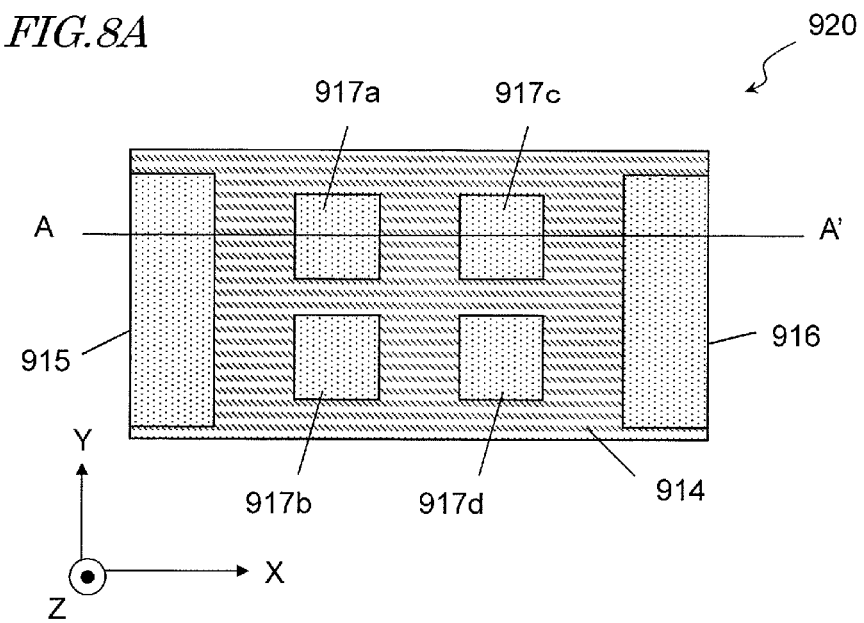
FIG. 8A shows a top view of a nonvolatile semiconductor device 920 disclosed in International Publication No. WO 2011/111305.
Figure 8B:
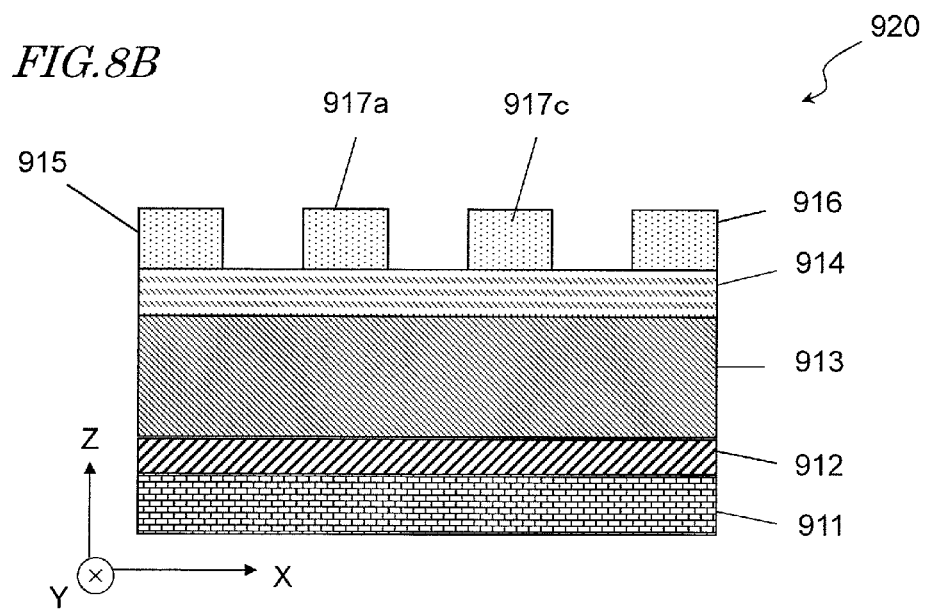
FIG. 8B shows a cross-sectional view of a nonvolatile semiconductor device 920 disclosed in International Publication No. WO 2011/111305.

FIG. 7 shows a timing diagram of the pulse voltage V1. As shown in FIG. 7, the pulse voltage V1 has a voltage V1 and an application period T1. The period between two adjacent pulse voltages V1s is defined as a period T2. Needless to say, the period T2 is longer than the period T1.

When the absolute values of the voltage V1 is greater than that of a voltage necessary to invert all the polarizations included in the ferroelectric film 13, the application of the pulse voltages V1 and V2 can not be repeated. Similarly, when the application period T1 is longer than a period necessary to invert all the polarizations included in the ferroelectric film 13, the application of the pulse voltages V1 and V2 can not be repeated.

The case where n=1 is excluded from the present invention. In other words, the case where the pulse voltages V1 and V2 are not repeated is excluded from the present invention. In case where n=1, the states shown in FIG. 2A, FIG. 2B, FIG. 3, and FIG. 4A is turned immediately into the state shown in FIG. 4B. This is because all the polarizations included in the ferroelectric film 13 are immediately set upwardly.

A specific voltage V1, a specific waveform, a specific period T1, and a specific period T2 of the pulse voltage V1 would be obvious for a skilled person who has read the instant specification, especially, the example thereof. It is beneficial that the waveform of the pulse voltage V1 is a rectangular waveform or a triangular waveform. It is more beneficial that the waveform of the pulse voltage V1 is a rectangular waveform.

The pulse voltage V2 is identical to the pulse voltage V1, for example. It is beneficial that the pulse voltage V2 is applied at the same time together with the pulse voltage V1.

As above, the application of the pulse voltages V1 and V2 is required to be repeated. In other words, the application of the pulse voltages V1 and V2 is repeated n times. Here, n represents an integer of two or more. Accordingly, the application of the pulse voltages V1 and V2 is repeated twice or more times. In this way, the state of the nonvolatile semiconductor device 20 is changed from the state shown in FIG. 3 to the state shown in FIG. 4A.

As is clear from FIG. 3 and FIG. 4A, the width WRH shown in FIG. 4A is smaller than the width WRH shown in FIG. 3. The width WRL1 shown in FIG. 4A is greater than the width WRL1 shown in FIG. 3. The width WRL2 shown in FIG. 4A is greater than the width WRL2 shown in FIG. 3.

Until the resistance value between the source electrode 15 and the drain electrode 16 becomes a predetermined resistance value or less, the application of the pulse voltages V1 and V2 is repeated. The state of the nonvolatile semiconductor device 20 may be changed to the state shown in FIG. 4B by the application of the pulse voltages V1 and V2. In FIG. 4B, the value of the width WRH is zero. In other words, the high-resistance area 32 disappears.

The resistance value between the source electrode 15 and the drain electrode 16 can be measured as below. Hereinafter, the term "resistance value" means the resistance value between the source electrode 15 and the drain electrode 16.

While both of the first upper gate electrode 17a and the second upper gate electrode 17b are maintained at a floating state, a voltage of 0 volts is applied to the lower gate electrode film 12. Furthermore, a voltage difference is applied between the source electrode 15 and the drain electrode 16. In this way, an electric current flowing through the semiconductor film 14 is measured.

It is beneficial that the absolute value of the voltage applied between the source electrode 15 and the drain electrode 16 is one-fifth or less of that of the pulse voltage V1. As one example, the voltage difference between the source electrode 15 and the drain electrode 16 is 0.1 volts. The resistance value is determined depending on the measured electric current.

Hereinafter, the resistance values of the semiconductor film 14 shown in FIG. 2A, FIG. 3, and FIG. 4A are referred to as a first resistance value, a second resistance value, and a third resistance value, respectively. As is clear from the above description, the following relationship (IV) is satisfied:

$$\text{the first resistance value} > \text{the second resistance value} > \text{the third resistance value} \quad (IV)$$

Example

The following example describes the present disclosure in more detail.

Example 1

The nonvolatile semiconductor device 20 according to the example 1 was fabricated by a method similar to the method disclosed in International Publication No. WO 2011/111305. More particularly, the nonvolatile semiconductor device 20 according to the example 1 was fabricated as below.

First, a silicon substrate 11 having a surface coated with a silicon oxide film was prepared.

A titanium film and a platinum film were formed on the silicon substrate 11 to form the lower gate electrode film 12. The titanium film had a thickness of 5 nanometers. The platinum film had a thickness of 30 nanometers.

Then, SrRuO$_3$ (hereinafter, referred to as "SRO") film was formed on the lower gate electrode film 12 by a pulse laser deposition method. The SRO film had a thickness of 10 nanometers.

While the silicon substrate 11 was heated to 700 degrees Celsius, a Pb(Zr, Ti)O$_3$ film was formed on the lower gate electrode film 12 by a pulse laser deposition method to form the ferroelectric film 13. The Pb(Zr, Ti)O$_3$ film had a thickness of 675 nanometers.

Next, while the silicon substrate 11 was heated to 400 degrees Celsius, a ZnO film was formed on the Pb(Zr, Ti)O$_3$ film to form the semiconductor film 14. The ZnO film had a thickness of 30 nanometers.

The patterns of resist were formed on the semiconductor film 14 with photolithography. Subsequently, the portions of the semiconductor film 14 not to be covered with the resist were removed with etching using nitric acid.

Subsequently, a resist was patterned on the semiconductor film 14 with photolithography again. A titanium film having a thickness of 5 nanometers and a platinum film having a thickness of 30 nanometers were formed with an electron beam deposition method.

The resist was removed to form the source electrode 15, the drain electrode 16, the first upper gate electrode 17a, and the second upper gate electrode 17b. Thus, the nonvolatile semiconductor device 20 according to example 1 was obtained.

The lengths Lx, Ly, LL, and IL (See FIG. 5) were 80 micrometers, 80 micrometers, 50 micrometers, and 60 micrometers, respectively.

First, reset operation was conducted. While voltages V1, V2, Vs, and Vd which satisfy the relationship: V1=V2=Vs=Vd=0 volts were applied to the first upper gate electrode 17a, the second upper gate electrode 17b, the source electrode 15, and the drain electrode 16, respectively, the voltage V3 of −15 volts was applied to the lower gate electrode film 12. The application of voltage V3 was 10 microseconds.

Then, the pulse voltages V1 and V2 were applied to the obtained nonvolatile semiconductor device 20. The pulse voltage V2 was identical to the pulse voltage V1.

The detail of the pulse voltage V1 is described below.
V1: −6 volts
T1: 10 nanoseconds
(See FIG. 7)

After the pulse voltages V1 and V2 were applied, a voltage difference of 0.1 volts was applied between the source electrode 15 and the drain electrode 16 to measure the electric current flowing through the semiconductor film 14. The measured electric current value was approximately $1.49 \times 10^{-6}$ ampere.

Figure 6:
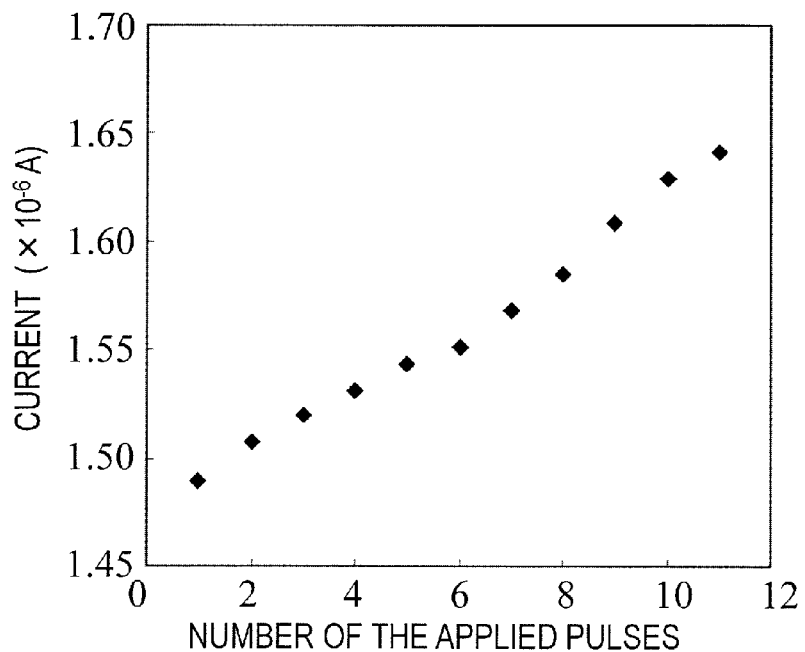
FIG. 6 is a graph showing the relationship between the electric current flowing through a semiconductor film 14 and the number of the applied pulses in the example 1.

After the period T2 of 2 microseconds elapsed, the pulse voltages V1 and V2 were applied to the obtained nonvolatile semiconductor device 20 again. Subsequently, the electric current flowing through the semiconductor film 14 was measured similarly. This was repeated ten times. FIG. 6 shows the relationship between the number of the times of the pulse application and the electric current flowing through the semiconductor film 14.

As is clear from FIG. 6, the electric current value is increased gradually with an increase of the number of the times of the pulse application.

A method for operating a nonvolatile semiconductor device according to an embodiment comprises steps of: a step (a) of preparing the nonvolatile semiconductor device, wherein the nonvolatile semiconductor device comprises a lower gate electrode film 12, a ferroelectric film 13, a semiconductor film 14, a source electrode 15, a drain electrode 16, a first upper gate electrode 17a, and a second upper gate electrode 17b; the lower gate electrode film 12, the ferroelectric film 13, and the semiconductor film 14 are stacked in this order; the source electrode 15, the drain electrode 16, the first upper gate electrode 17a, and the second upper gate electrode 17b are formed on the semiconductor film 14; Z direction represents a stack direction of the lower gate electrode film 12, the ferroelectric film 13, and the semiconductor film 14; when viewed in a top view, the source electrode 15 and the drain electrode 16 face each other along X direction; when viewed in a top view, the first upper gate electrode 17a and the second upper gate electrode 17b face each other along Y direction; the X direction and the Y direction are perpendicular to each other; both of the X direction and the Y direction are perpendicular to the Z direction; a high-resistance area 32, a first low-resistance area 31a, and a second low-resistance area 31b are formed in the semiconductor film 14; when viewed in a top view, the high-resistance area 32 has a width WRH along the Y direction; when viewed in a top view, the first low-resistance area 31a has a width WRL1 along the Y direction; when viewed in a top view, the second low-resistance area 31b has a width WRL2 along the Y direction; the value of the width WRH is not less than zero; the value of the width WRL1 is not less than zero; the value of the width WRL2 is not less than zero; when viewed in a top view, the high-resistance area 32, the first low-resistance area 31a, and the second low-resistance area 31b are interposed between the first upper gate electrode 17a and the second upper gate electrode 17b; when viewed in a top view, the first low-resistance area 31a is interposed between the first upper gate electrode 17a and the high-resistance area 32; when viewed in a top view, the second low-resistance area 31b is interposed between the second upper gate electrode 17b and the high-resistance area 32; and when viewed in a top view, the high-resistance area 32 is interposed between the first low-resistance area 31a and the second low-resistance area 31b; a step (b) of applying pulse voltages V1 and V2 to the first upper gate electrode 17a and the second upper gate electrode 17b, respectively, for a period T1 which is shorter than a period necessary to invert all the polarizations included in the ferroelectric film 13, while voltages Vs, Vd, and V3 are applied to the source electrode 15, the drain electrode 16, and the lower gate electrode film 12, respectively, so as to increase the values of the widths WRL1 and WRL2 and so as to decrease the value of the width WRH, wherein the absolute value of the pulse voltage V1 is smaller than that of a voltage necessary to invert all the polarizations included in the ferroelectric film 13; the absolute value of the pulse voltage V2 is smaller than that of a voltage necessary to invert all the polarizations included in the ferroelectric film 13; and the voltage Vs, the voltage Vd, the voltage V3, the pulse voltage V1, and the pulse voltage V2 satisfy the following relationship (I): Vs, Vd, V3>V1, V2 (I); and a step (c) of repeating the step (b) n times (n represents an integer of two or more), until a resistance value between the source electrode 15 and the drain electrode 16 becomes a predetermined value or less.

In one embodiment, the ferroelectric film 13 is in contact with the semiconductor film 14.

In one embodiment, the following relationships (II) and (III) are satisfied:

$$Vs=Vd=V3 \tag{II}$$

$$V1=V2<V3 \tag{III}$$

In one embodiment, n is three or more.
In one embodiment, n is five or more.
In one embodiment, n is ten or more.
In one embodiment, before the step (b) is conducted, both of the values of widths WRL1 and WRL2 are zero.

In one embodiment, after the step (c) is conducted, the value of the width WRH is zero.

A method for operating a nonvolatile semiconductor device according to another embodiment comprises steps of: a step (a) of preparing the nonvolatile semiconductor device, wherein the nonvolatile semiconductor device comprises a lower gate electrode film 12, a ferroelectric film 13, a semiconductor film 14, a source electrode 15, a drain electrode 16, a first upper gate electrode 17a, and a second upper gate electrode 17b; the lower gate electrode film 12, the ferroelectric film 13, and the semiconductor film 14 are stacked in this order; the source electrode 15, the drain electrode 16, the first upper gate electrode 17a, and the second upper gate electrode 17b are formed on the semiconductor film 14; Z direction represents a stack direction of the lower gate electrode film 12, the ferroelectric film 13, and the semiconductor film 14; when viewed in a top view, the source electrode 15 and the drain electrode 16 face each other along X direction; when viewed in a top view, the first upper gate electrode 17a and the second upper gate electrode 17b face each other along Y direction; the X direction and the Y direction are perpendicular to each other; both of the X direction and the Y direction are perpendicular to the Z direction; a high-resistance area 32, a first low-resistance area 31a, and a second low-resistance area 31b are formed in the semiconductor film 14; when viewed in a top view, the high-resistance area 32 has a width WRH along the Y direction; when viewed in a top view, the first low-resistance area 31a has a width WRL1 along the Y direction; when viewed in a top view, the second low-resistance area 31b has a width WRL2 along the Y direction; the value of the width WRH is not less than zero; the value of the width WRL1 is not less than zero; the value of the width WRL2 is not less than zero; when viewed in a top view, the high-resistance area 32, the first low-resistance area 31a, and the second low-resistance area 31b are interposed between the first upper gate electrode 17a and the second upper gate electrode 17b; when viewed in a top view, the first low-resistance area 31a is interposed between the first upper gate electrode 17a and the high-resistance area 32; when viewed in a top view, the second low-resistance area 31b is interposed between the second upper gate electrode 17b and the high-resistance area 32; and when viewed in a top view, the high-resistance area 32 is interposed between the first low-resistance area 31a and the second low-resistance area 31b; a step (b) of applying pulse voltages V1 and V2 to the first upper gate electrode 17a and the second upper gate electrode 17b, respectively, for a period T1 which is shorter than a period necessary to invert all the polarizations included in the ferroelectric film 13, while voltages Vs, Vd, and V3 are applied to the source electrode 15, the drain electrode 16, and the lower gate electrode film 12, respectively, so as to increase the values of the widths WRL1 and WRL2 and so as to decrease the value of the width WRH, wherein the absolute value of the pulse voltage V1 is smaller than that of a voltage necessary to invert all the polarizations included in the ferroelectric film 13; the absolute value of the pulse voltage V2 is smaller than that of a voltage necessary to invert all the polarizations included in the ferroelectric film 13; and the voltage Vs, the voltage Vd, the voltage V3, the pulse voltage V1, and the pulse voltage V2 satisfy the following relationship (I): Vs, Vd, V3>V1, V2 (I); and a step (c) of applying the pulse voltages V1 and V2 again to the first upper gate electrode 17a and the second upper gate electrode 17b, respectively, for the period T1, while voltages Vs, Vd, and V3 are applied to the source electrode 15, the drain electrode 16, and the lower gate electrode film 12, respectively, so as to increase the values of the widths WRL1 and WRL2 more and so as to decrease the value of the width WRH more.

In one embodiment, the ferroelectric film 13 is in contact with the semiconductor film 14.

In one embodiment, the following relationships (II) and (III) are satisfied:

$$Vs=Vd=V3 \quad (II)$$

$$V1=V2<V3 \quad (III).$$

In one embodiment, n is three or more.

In one embodiment, n is five or more.

In one embodiment, n is ten or more.

In one embodiment, before the step (b) is conducted, both of the values of widths WRL1 and WRL2 are zero.

In one embodiment, after the step (c) is conducted, the value of the width WRH is zero.

The method according to the present disclosure may be used for a multivalued memory and a variable resistance element.

Embodiments have been described above as an illustration of the technique of the present disclosure. The accompanying drawings and the detailed description are provided for this purpose. Thus, elements appearing in the accompanying drawings and the detailed description include not only those that are essential to solving the technical problems set forth herein, but also those that are not essential to solving the technical problems but are merely used to illustrate the technique disclosed herein. Therefore, those non-essential elements should not immediately be taken as being essential for the reason that they appear in the accompanying drawings and/or in the detailed description.

The embodiments above are for illustrating the technique disclosed herein, and various changes, replacements, additions, omissions, etc., can be made without departing from the scope defined by the claims and equivalents thereto.

What is claimed is:

1. A method for operating a nonvolatile semiconductor device, the method comprising steps of:
    a step (a) of preparing the nonvolatile semiconductor device, wherein
    the nonvolatile semiconductor device comprises a lower gate electrode film, a ferroelectric film, a semiconductor film, a source electrode, a drain electrode, a first upper gate electrode, and a second upper gate electrode;
    the lower gate electrode film, the ferroelectric film, and the semiconductor film are stacked in this order;
    the source electrode, the drain electrode, the first upper gate electrode, and the second upper gate electrode are formed on the semiconductor film;
    Z direction represents a stack direction of the lower gate electrode film, the ferroelectric film, and the semiconductor film;
    when viewed in a top view, the source electrode and the drain electrode face each other along X direction;
    when viewed in a top view, the first upper gate electrode and the second upper gate electrode face each other along Y direction;
    the X direction and the Y direction are perpendicular to each other;
    both of the X direction and the Y direction are perpendicular to the Z direction;
    a high-resistance area, a first low-resistance area, and a second low-resistance area are formed in the semiconductor film;

when viewed in a top view, the high-resistance area has a width WRH along the Y direction;

when viewed in a top view, the first low-resistance area has a width WRL1 along the Y direction;

when viewed in a top view, the second low-resistance area has a width WRL2 along the Y direction;

the value of the width WRH is not less than zero;

the value of the width WRL1 is not less than zero;

the value of the width WRL2 is not less than zero;

when viewed in a top view, the high-resistance area, the first low-resistance area, and the second low-resistance area are interposed between the first upper gate electrode and the second upper gate electrode;

when viewed in a top view, the first low-resistance area is interposed between the first upper gate electrode and the high-resistance area;

when viewed in a top view, the second low-resistance area is interposed between the second upper gate electrode and the high-resistance area; and when viewed in a top view, the high-resistance area is interposed between the first low-resistance area and the second low-resistance area;

a step (b) of applying pulse voltages V1 and V2 to the first upper gate electrode and the second upper gate electrode, respectively, for a period T1 which is shorter than a period necessary to invert all the polarizations included in the ferroelectric film, while voltages Vs, Vd, and V3 are applied to the source electrode, the drain electrode, and the lower gate electrode film, respectively, so as to increase the values of the widths WRL1 and WRL2 and so as to decrease the value of the width WRH, wherein the absolute value of the pulse voltage V1 is smaller than that of a voltage necessary to invert all the polarizations included in the ferroelectric film;

the absolute value of the pulse voltage V2 is smaller than that of a voltage necessary to invert all the polarizations included in the ferroelectric film; and the voltage Vs, the voltage Vd, the voltage V3, the pulse voltage V1, and the pulse voltage V2 satisfy the following relationship (I):

$$Vs, Vd, V3 > V1, V2 \quad (1); \text{ and}$$

a step (c) of repeating the step (b) n times (n represents an integer of two or more), until a resistance value between the source electrode and the drain electrode becomes a predetermined value or less.

2. The method according to claim 1, wherein the ferroelectric film is in contact with the semiconductor film.

3. The method according to claim 1, wherein the following relationships (II) and (III) are satisfied:

$$Vs = Vd = V3 \quad (II)$$

$$V1 = V2 < V3 \quad (III).$$

4. The method according to claim 1, wherein n is three or more.

5. The method according to claim 1, wherein n is five or more.

6. The method according to claim 1, wherein n is ten or more.

7. The method according to claim 1, wherein before the step (b) is conducted, both of the values of widths WRL1 and WRL2 are zero.

8. The method according to claim 1, wherein after the step (c) is conducted, the value of the width WRH is zero.

9. A method for operating a nonvolatile semiconductor device, the method comprising steps of:

a step (a) of preparing the nonvolatile semiconductor device, wherein the nonvolatile semiconductor device comprises a lower gate electrode film, a ferroelectric film, a semiconductor film, a source electrode, a drain electrode, a first upper gate electrode, and a second upper gate electrode;

the lower gate electrode film, the ferroelectric film, and the semiconductor film are stacked in this order;

the source electrode, the drain electrode, the first upper gate electrode, and the second upper gate electrode are formed on the semiconductor film;

Z direction represents a stack direction of the lower gate electrode film, the ferroelectric film, and the semiconductor film;

when viewed in a top view, the source electrode and the drain electrode face each other along X direction;

when viewed in a top view, the first upper gate electrode and the second upper gate electrode face each other along Y direction;

the X direction and the Y direction are perpendicular to each other;

both of the X direction and the Y direction are perpendicular to the Z direction;

a high-resistance area, a first low-resistance area, and a second low-resistance area are formed in the semiconductor film;

when viewed in a top view, the high-resistance area has a width WRH along the Y direction;

when viewed in a top view, the first low-resistance area has a width WRL1 along the Y direction;

when viewed in a top view, the second low-resistance area has a width WRL2 along the Y direction;

the value of the width WRH is not less than zero;

the value of the width WRL1 is not less than zero;

the value of the width WRL2 is not less than zero;

when viewed in a top view, the high-resistance area, the first low-resistance area, and the second low-resistance area are interposed between the first upper gate electrode and the second upper gate electrode;

when viewed in a top view, the first low-resistance area is interposed between the first upper gate electrode and the high-resistance area;

when viewed in a top view, the second low-resistance area is interposed between the second upper gate electrode and the high-resistance area; and when viewed in a top view, the high-resistance area is interposed between the first low-resistance area and the second low-resistance area;

a step (b) of applying pulse voltages V1 and V2 to the first upper gate electrode and the second upper gate electrode, respectively, for a period T1 which is shorter than a period necessary to invert all the polarizations included in the ferroelectric film, while voltages Vs, Vd, and V3 are applied to the source electrode, the drain electrode, and the lower gate electrode film, respectively, so as to increase the values of the widths WRL1 and WRL2 and so as to decrease the value of the width WRH, wherein the absolute value of the pulse voltage V1 is smaller than that of a voltage necessary to invert all the polarizations included in the ferroelectric film;

the absolute value of the pulse voltage V2 is smaller than that of a voltage necessary to invert all the polarizations included in the ferroelectric film; and the voltage Vs, the voltage Vd, the voltage V3, the pulse voltage V1, and the pulse voltage V2 satisfy the following relationship (I):

$$Vs, Vd, V3 > V1, V2 \qquad \text{(I); and}$$

a step (c) of applying the pulse voltages V1 and V2 again to the first upper gate electrode and the second upper gate electrode, respectively, for the period T1, while voltages Vs, Vd, and V3 are applied to the source electrode, the drain electrode, and the lower gate electrode film, respectively, so as to increase the values of the widths WRL1 and WRL2 more and so as to decrease the value of the width WRH more.

10. The method according to claim 9, wherein the ferroelectric film is in contact with the semiconductor film.

11. The method according to claim 9, wherein the following relationships (II) and (III) are satisfied:

$$Vs = Vd = V3 \qquad \text{(II)}$$

$$V1 = V2 < V3 \qquad \text{(III).}$$

12. The method according to claim 9, wherein n is three or more.

13. The method according to claim 9, wherein n is five or more.

14. The method according to claim 9, wherein n is ten or more.

15. The method according to claim 9, wherein before the step (b) is conducted, both of the values of widths WRL1 and WRL2 are zero.

16. The method according to claim 9, wherein after the step (c) is conducted, the value of the width WRH is zero.

\* \* \* \* \*